Dec. 10, 1968 JEAN-PIERRE BIET 3,416,009

STATIC CIRCUIT BREAKER HAVING A SEMICONDUCTOR COMPONENT

Filed Dec. 4, 1964 2 Sheets-Sheet 1

Jean-Pierre Biet
By: Edwin E. Grigg

Dec. 10, 1968 JEAN-PIERRE BIET 3,416,009

STATIC CIRCUIT BREAKER HAVING A SEMICONDUCTOR COMPONENT

Filed Dec. 4, 1964 2 Sheets-Sheet 2

Jean-Pierre Biet
by: Edwin E. Greigg 3,416,009
Patented Dec. 10, 1968

3,416,009

STATIC CIRCUIT BREAKER HAVING A SEMICONDUCTOR COMPONENT

Jean-Pierre Biet, Saulx-les-Chartreux, France, assignor to Compagnie Generale d'Electricite, Paris, France Filed Dec. 4, 1964, Ser. No. 416,051
Claims priority, application France, Dec. 12, 1963, 956,990; Mar. 11, 1964, 966,972
8 Claims. (Cl. 307—299)

The present invention is directed to semiconductor devices and, more particularly, to such devices which are capable of being used as intermittent conductors in response to a driving voltage.

Known semiconductor devices comprise at least three alternate semiconducting layers of opposite conduction types, making up a transistor the first layer of which constitutes the emitter and the second layer constitutes the base, these different layers having the dopings required for insuring that the junction between the first two layers be of the backward type, that is, the particular case where the FERMI level coincides with a barrier of the band of valence, or of the band of conduction.

Similar to conventional transistors, a transistor with a backward emitter presents what is generally termed the "transistor effect", i.e., the possibility of controlling the current reaching the collector by injecting in its base a current of appropriate direction and amplitude.

It is known, however, that the transistors having a backward emitter show a poor gain. It results in the necessity to inject at the control leads a relatively high current so as to cause the triggering of the device, if the main alternating voltage applied is relatively small.

Accordingly, it is the principal object of the present invention to overcome the above difficulties.

In one embodiment of the semiconducting device according to the present invention, there is provided a central layer, at least one intermediate layer applied on at least one side of the central layer and of opposite conduction type from the conduction type of the central layer, and a main outer layer applied on the intermediate layer and of opposite conduction type from the conduction type of the intermediate layer and wherein it is characterized by the fact that the main outer layer is applied on only a part of the surface of the intermediate layer and that another layer, an auxiliary outer layer, of the same conduction type as the main outer layer, is applied on a fraction of the part of the intermediate layer not covered by the main outer layer. The dopings on either side of the junctions between the layers are such that the junction between the auxiliary outer layer and the intermediate layer have different characteristics from those of the junction between the main outer layer and the intermediate layer.

A detailed description of the invention will appear in the following sepcification and attached drawings illustrating, as non-limiting examples, possible embodiments of the invention in which.

Figure 2:
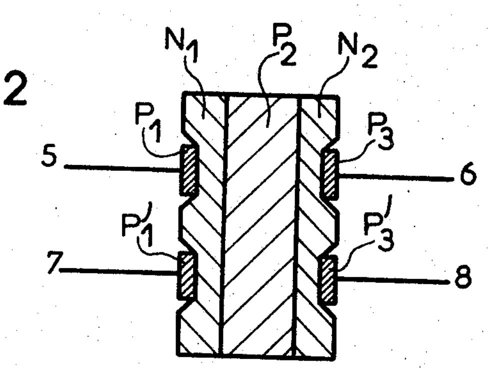
FIG. 2 illustrates an embodiment of the device according to this invention.
Figure 5:
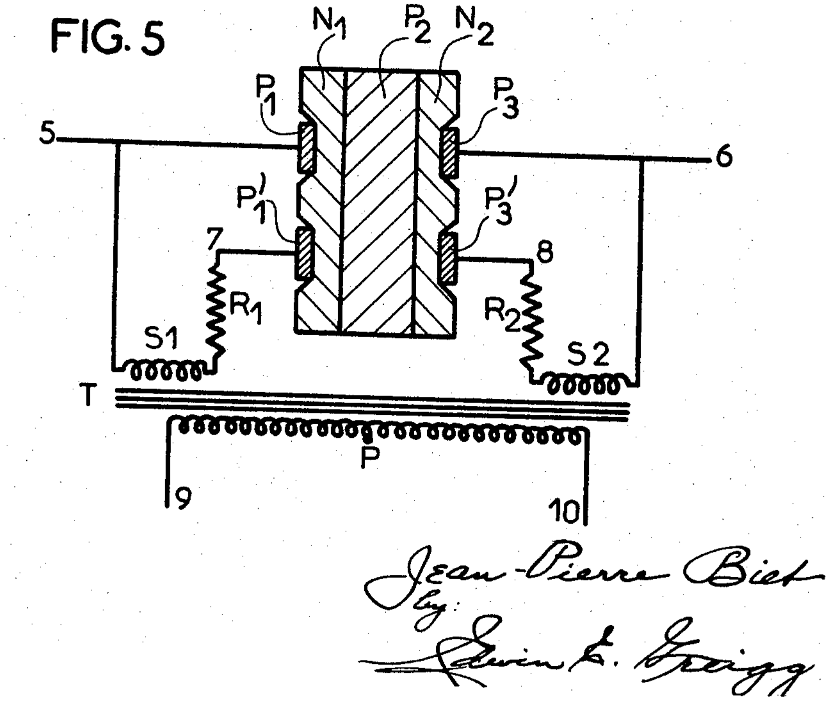
Figure 3A:
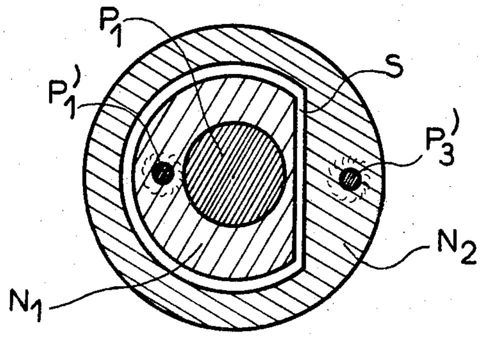
Figure 3B:
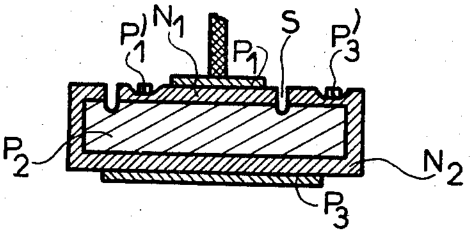
Figure 3C:
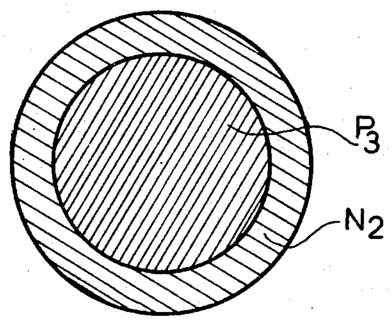
Figure 4A:
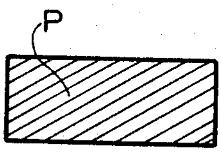
Figure 4B:
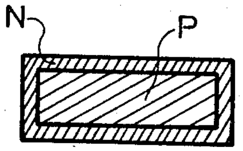
Figure 4C:
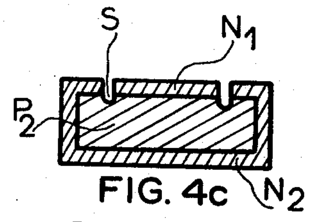

FIG. 3*a* is a plan view of a further embodiment of the present invention according to FIG. 2;

FIG. 3*b* is a cross-sectional view of the embodiment shown in FIG. 3*a*;

FIG. 3*c* is a bottom plan view of the embodiment shown in FIG. 3*a*;

FIGS. 4*a*, 4*b* and 4*c* illustrate the steps of the manufacturing process according to the invention; and FIG. 5 illustrates the uses of the device according to the invention of FIG. 2.

Figure 1:
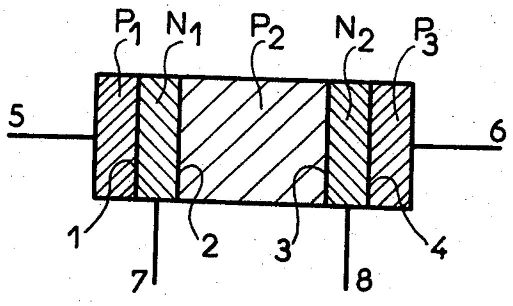
FIG. 1 shows schematically a device according to the prior art.

The known device according to FIG. 1 comprises a low doping central layer $P_2$ sandwiched between two intermediate layers $N_1$ and $N_2$ and two outer layers $P_1$ and $P_3$ these four layers having high dopings.

The outer junction 1 between $P_1$ and $N_1$ and 4 between $N_2$ and $P_3$ are of the backward type, while the intermediate junctions 2 between $N_1$ and $P_2$ and 3 between $P_2$ and $N_2$ are of the normal type.

The main leads 5 and 6 are connected respectively to the outer layers $P_1$ and $P_3$, and the auxiliary leads 7 and 8 are connected respectively to the intermediate layers $N_1$ and $N_2$.

This device constitutes a symmetrical semiconducting unit having, when not biased between the leads 7 and 8, a high impedance between the main leads 5 and 6, provided, however, that the alternating voltage applied between the latter have a peak value not exceeding a value called "natural triggering voltage".

On the other hand, if it is desired to make said impedance negligible, i.e., to make the device "conducting" between the main leads 5 and 6 (this procedure being usually referred to as "triggering"), it suffices to inject a driving current of adequate direction and amplitude in either one of the auxiliary connections 7 and 8. According to the polarity of this current 3 and depending on which one of said auxiliary connections it is applied to, the device will be made conducting for one or the other of the two half-waves of the alternating current applied between 5 and 6.

This control of the triggering by the driving voltage applied directly to $N_1$ (or $N_2$), however, makes use, in order to act upon the current between 5 and 6, of the transistor constituted by the layer $P_1N_1P_2$ (or $P_3N_2P_2$), the emitter of which, constituted by the junction (1 or 4) is, as seen previously, of the backward type.

The device in FIG. 2 differs from the device according to FIG. 1 in that the control leads 7 and 8, instead of being connected directly to the intermediate layers $N_1$ and $N_2$, are connected to the auxiliary outer layers $P'_1$ and $P'_3$, which cover respectively a part of the surface of said intermediate layers $N_1$ and $N_2$, not covered by the main outer layers $P_1$, $P_3$.

The resulting device is hence constituted by the set of two transistors $P_1N_1P_2$ and $P'_1N_1P_2$ (and $P_3N_2P_2$ and $P'_3N_2P_2$) having a common base $N_1$ (or $N_2$) and two distinct emitters $P_1$ and $P'_1$ (or $P_3$ and $P'_3$), one of these transistors $P_1N_1P_2$ (or $P_3N_2P_2$) constituting the main transistor in which flows the controlled current between the leads 5 and 6, while the other transistor $P'_1N_1P_2$ (or $P'_3N_2P_2$) constitutes an auxiliary control transistor in which is injected the driving current through lead 7 (or 8).

It is obvious that, because it comprises two distinct transistors for the driving current and for the controlled current, such a device is of a much more flexible utilization than a single transistor device of the prior art, since each of the two transistors can be given characteristics better adjusted to its required duty.

While preserving for the main junction between $P_1$ and $N_1$ (or $P_3$ and $N_2$) a backward junction characteristic, this being advantageous for the flowing of the controlled current, a normal diode junction characteristic is selected for the auxiliary junction $P'_1$ and $N_1$ (or $P'_3$ and $N_2$), this avoiding the difficulty mentioned above and enabling to control the main current with a relatively low driving current.

In order to achieve these different characteristics for the junctions $N_1P_1$ (or $N_2P_3$) and $N_1P'_1$ (or $N_2P'_3$), it is possible, according to the invention, to use a non-homogeneous doping concentration throughout layer $N_1$ (or $N_2$), that is one having a different impurity concentration in front of the main outer layer $P_1$ (or $P_3$) and in front of the auxiliary outer layer $P'_1$ (or $P'_3$). In the above-mentioned example, this concentration is appreciably lower in front of the layer $P'_1$ (in order to achieve a normal characteristic) than in front of the layer $P_1$ where a backward characteristic is required.

The operation of the device designed in accordance with the description above will now be described.

It is assumed that, at a given instant of time, the half-wave of the alternating current applied between the main electrodes 5, 6, is in a direction such that the layer $P_3$ be negative with respect to the main outer layer $P_1$. If one then applies on the auxiliary outer layer $P'_1$ a voltage pulse so that this layer be positive with reference to $P_1$, said pulse will unblock the auxiliary control transistor $P'_1N_1P_2$. The main outer layer $P_1$ then constitutes simply a "base contact" with the intermediate layer $N_1$ since, as is known, a "reverse" biased backward junction shows a very low resistance and hence constitutes an excellent "ohmic" contact.

Applied to the whole device through the transistor $P'_1N_1P_2$ thus unblocked, the current causes the triggering of the arrangement $P_1N_1P_2N_2P_3$, even if the driving pulse applied to $P'_1$ is relatively weak since, as explained above, the auxiliary control transistor $P'_1N_1P_2$ has an emitter with a normal characteristic rather than a backward characteristic.

The device being thus started, the main alternating current will all flow through the layer $P_1$, if, in the case when there is a galvanic connection between the main circuit and the driving circuit, the precaution has been taken to insert in the latter a resistance of a sufficiently high value so as to prevent the flowing of a noticeable part of said main current into said driving circuit.

According to another embodiment of the invention, shown in FIGS. 3*a* and 3*b*, the second intermediate layer $N_2$ is applied not only on the whole of one of the faces of the central layer $P_2$ (this face will subsequently be referred to as the "lower face" although this wording in no way determines the position of the device), but also on its edges and it extends on the periphery of the "upper" face of the central layer $P_2$, while the first intermediate layer $N_1$ is applied on the central part of said upper face where it is separated from the peripheral intermediate layer $N_2$ by a groove S reaching down to the central layer $P_2$. To the second intermediate layer $N_2$ are associated a main external layer $P_3$ applied on the "lower" face of said layer $N_2$ as shown in FIG. 3*c*, and an auxiliary outer layer $P'_3$ applied to the "upper" periphery of said layer $N_2$. As for the main auxiliary outer layers $P_1$ and $P'_1$ associated to the first intermediate layer $N_1$, they are naturally located, as said intermediate layer itself, on the "upper" face of the device.

Therefore, the device according to the invention comprises on its lower face a main outer layer ($P_3$), as shown in FIG. 3*c*, covering almost all of the "lower" face and it may hence be fitted on this face with a metallic support facilitating the mechanical assembly of the device as well as heat disposal.

FIGS. 4*a*, 4*b* and 4*c* show three steps of the manufacturing process of the device according to FIGS. 3*a*, 3*b* and 3*c*.

A block of P type material (FIG. 4*a*) is coated completely with an N type layer (FIG. 4*b*) and finally, a groove S is cut out along a closed curve, in order to separate the N type layer into two layers $N_2$ and $N_1$ arranged as mentioned above with reference to FIGS. 3*a*, 3*b* and 3*c*.

FIG. 5 shows schematically a possible diagram for the utilization of the device according to the invention. The main current is applied through the leads 5, 6 to the main outer layers $P_1$ and $P_3$; moreover, the lead 5 is connected to the first auxiliary outer layer $P'_1$ via the secondary winding $S_1$ of a transformer T and via a resistance $R_1$; similarly, the lead 6 is connected to the second auxiliary outer layer $P'_3$, via a second secondary winding $S_2$ of said transformer and via a resistance $R_2$. The driving voltage is applied between the leads 9 and 10 of the primary winding P of the transformer T.

It is to be understood that the device according to the invention could comprise NPNPN type layers instead of the PNPNP type layers as in the examples described.

Although several embodiments of the invention have been depicted and described, it will be apparent that these embodiments are illustrative in nature and that a number of modifications in the apparatus and variations in its end use may be effected without departing from the spirit or scope of the invention as defined in the appended claims.

What I claim is:

1. A static circuit breaker for controlling a circuit having a semiconductor component comprising a central layer of a first type of conductivity having two major faces, two intermediate layers of a second type of conductivity each contiguous with one of said major faces and forming a P-N junction therewith, first and second exterior layers of the first type of conductivity on each of said intermediate layers spaced from said central layer and forming P-N junctions with said intermediate layers, means varying the doping concentration adjacent the junction formed by said first exterior layers to effect backward diode characteristics and further means for varying the doping concentration adjacent the junction formed by said second exterior layers to effect a normal diode characteristic and electrode means connected to said exterior layers.

2. A static circuit breaker according to claim 1, wherein the intermediate layers have a strong homogeneous doping, the first exterior layers have a strong doping, and the second exterior layers have a weak doping.

3. A static circuit breaker as defined in claim 1, in which the intermediate layers have a non-homogeneous doping concentration being stronger in the region of said layers with respect to the first exterior layers than in the region of said layers with respect to the second external layers.

4. A device as claimed in claim 1, wherein one of said intermediate layers is applied on the whole surface of one of the major faces and on the edges of said central layer and on the periphery of the other face of said central layer where it is separated from the other of said intermediate layers by a groove forming a closed curve, said first exterior layer associated with said one intermeidate layer being located on the lower face thereof and said second exterior layer being applied on the upper peripheral part of said one intermeidate layer.

5. A semiconductor device as claimed in claim 1, wherein one of said second exterior layers is connected to the corresponding first exterior layer by the secondary winding of a transformer, the primary winding of said transformer having a driving voltage applied thereto.

6. A static circuit breaker according to claim 1, wherein said first exterior layers are connected in the circuit to be controlled, and a generator means supplying positive and negative impulses connected to the second exterior layers to thereby render the semiconductor component either passing or blocking.

7. A semiconductor device as claimed in claim 1, wherein a main circuit for conducting and non-conducting is connected between the first exterior layers, and an auxiliary circuit connected to a control voltage connects said second exterior layers.

8. A semiconductor device according to claim 7, wherein a resistance is series-connected in said auxiliary circuit when said main and said auxiliary circuits are connected galvanically.

References Cited

UNITED STATES PATENTS

| | | | |
|---|---|---|---|
| 2,967,793 | 1/1961 | Philips | 148—33 |
| 3,123,750 | 3/1964 | Hutson et al. | 317—235 |
| 3,140,963 | 7/1964 | Svedberg | 148—33.5 |
| 3,196,330 | 7/1965 | Moyson | 317—235 |

JOHN W. HUCKERT, *Primary Examiner.*

R. F. SANDLER, *Assistant Examiner.*

U.S. Cl. X.R.

317—235